(12) United States Patent
Hung et al.

(10) Patent No.: US 7,317,229 B2
(45) Date of Patent: Jan. 8, 2008

(54) GATE ELECTRODE STRUCTURES AND METHODS OF MANUFACTURE

(75) Inventors: Steven C. H. Hung, Sunnyvale, CA (US); Gary E. Miner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 180 days.

(21) Appl. No.: 11/185,180

(22) Filed: Jul. 20, 2005

(65) Prior Publication Data

US 2007/0018244 A1 Jan. 25, 2007

(51) Int. Cl.
*H01L 29/94* (2006.01)

(52) U.S. Cl. ............... 257/369; 257/412; 257/E27.062; 438/592

(58) Field of Classification Search ............... 257/369
See application file for complete search history.

(56) References Cited

U.S. PATENT DOCUMENTS

| | | | |
|---|---|---|---|
| 6,551,399 B1 | 4/2003 | Sneh et al. | |
| 6,630,391 B2 | 10/2003 | Agarwal et al. | |
| 6,696,333 B1 | 2/2004 | Zheng et al. | |
| 6,784,096 B2 | 8/2004 | Chen et al. | |
| 6,790,731 B2 | 9/2004 | Zheng et al. | |
| 6,794,232 B2 | 9/2004 | Zheng et al. | |
| 6,797,553 B2 | 9/2004 | Adkisson et al. | |
| 6,818,517 B1 | 11/2004 | Maes | |
| 6,875,271 B2 | 4/2005 | Glenn et al. | |
| 6,879,009 B2 | 4/2005 | Zheng et al. | |
| 2004/0106261 A1* | 6/2004 | Huotari et al. ............... 438/287 |
| 2004/0198069 A1 | 10/2004 | Metzner et al. | |
| 2004/0219772 A1 | 11/2004 | You et al. | |
| 2005/0032342 A1 | 2/2005 | Forbes et al. | |
| 2005/0042865 A1 | 2/2005 | Cabral, Jr. et al | |

OTHER PUBLICATIONS

Gao, Wei, et al., "Stacked Metal Layers as Gates for MOSFET Threshold Voltage Control", *Mat. Res. Soc. Symp. Proc.* vol. 765, (2003),D1.4.1-D1.4.6.

Hung, Steven C. H., et al., "Improved Workfunction Tunability and EOT Control with Clustered ALD TaN/PVD Ta for Multilayer Metal Gate", *2005 Materials Research Society Spring Meeting*, Mar. 28-Apr. 1, 2005 San Francisco, (Apr. 2005),paper No. 127094, Abstract No. CAG10.4.

Hung, Steven C. H., et al., "Multilayer Metallic Gate Electrode for Depletion Suppression and Tunable Workfunction", *Semiconductor Interface Specialists Conference*, (Dec. 1, 2003).

Polishchuk, Igor, et al., "Dual Work Function Metal Gate CMOS Technology Using Metal Interdiffusion", *IEEE Electron Device Letters* vol. 22, No. 9, (Sep. 2001), 444-446.

Polishchuk, Igor, et al., "Polycrystalline silicon/metal stacked gate for threshold voltage control in metal-oxide-semiconductor field-effect transistors", *Applied Physics Letters*, vol. 76, No. 14, (Apr. 3, 2000), 1938-1940.

Tsai, W., et al., "Surface preparation and interfacial stability of high-k dielectrics deposited by atomic layer chemical vapor deposition", *Microelectronic Engineering* vol. 65, (2003), 259-272.

* cited by examiner

*Primary Examiner*—Tu-Tu Ho
(74) *Attorney, Agent, or Firm*—Diehl Servilla, LLC

(57) ABSTRACT

Gate electrode structures used in field effect transistors and integrated circuits and methods of manufacture are disclosed. Improved work function and threshold modulation are provided by the methods and structures.

15 Claims, 4 Drawing Sheets

GATE ELECTRODE STRUCTURES AND METHODS OF MANUFACTURE

FIELD OF THE INVENTION

This invention generally relates to materials and methods used during integrated circuit manufacture.

BACKGROUND OF THE INVENTION

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET).

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin (for example, 10 to 50 Angstroms) material layer having a dielectric constant of about 4.0 or greater (for example, silicon dioxide ($SiO_2$), silicon oxynitride (SiON), hafnium dioxide ($HfO_2$), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like). Replacement of polysilicon as a traditional material of the gate electrode with metals and metal-containing compounds reduces undesired voltage drops associated with the polysilicon depletion effect, as well as increases drive current performance and the operational speed of the CMOS transistor.

As mentioned above, alternative materials have been investigated as replacements for polysilicon gates. In addition, alternative structures have been investigated as replacements for polysilicon gates. Examples of such structures include bilayer structures made from conductive metals with different work function values. These structures, which will be referred to herein as bilayer gates or sandwich gates, include a gate dielectric formed on a substrate, with a first metal layer and a second metal layer formed over the gate dielectric. Although improvements to semiconductor gate electrodes have been made through the use of alternative gate structures and materials, further improvements are desired to improve the performance of integrated circuit devices.

SUMMARY OF INVENTION

One aspect of the present invention relates to a method of forming a gate electrode comprising forming a dielectric layer on a semiconductor substrate, forming a first metal region on the dielectric layer by atomic layer deposition, and forming a second metal region on the first metal region. In certain embodiments, the first metal region includes TaN and the second metal region includes Ta. In other embodiments the first and second metal regions are formed by deposition in a clustered system or apparatus, wherein the first metal region is formed and the second metal region is formed over the first metal region without exposing the first metal region to air or ambient atmosphere.

Another aspect of the present invention relates to a method of forming a field effect transistor comprising forming a pair of source and drain regions in a semiconductor substrate, forming dielectric layer on the semiconductor substrate; and depositing a first metal region over the gate dielectric layer using atomic layer deposition, and forming a second metal region over the first metal layer. It will be understood that the methods disclosed herein are not limited to any particular order of steps. For example, in the method described immediately above, the source and drain regions may be formed before or after formation of the dielectric layer and the metal gate electrode. According to certain embodiments, the first metal region includes TaN and the second metal region includes Ta. In certain embodiments the second metal region is formed over the second metal region in clustered system in which the first metal region is not exposed to air or ambient atmosphere prior to formation of the second metal layer.

According to certain embodiments, varying the thickness of the first metal region by a first amount between about 0 and 80 Angstroms changes the effective work function of the combined first and second regions by at least about 20% greater than the change in effective work function of the combined first and second regions compared to when the thickness of the first region is varied by the same first amount but exposed to air prior to formation of the second region (e.g., by forming the first and second regions in a non-clustered system). In other embodiments, the method is effective to change the work function of the combined first and second regions by varying the thickness of the first metal region by a first amount between about 0 and 80 Angstroms by at least about 40%, 60%, and 80% greater than the change in effective work function of the combined first and second regions compared to when the thickness of the first region is varied by the same first amount but exposed to air prior to formation of the second region. For example, when the first metal region includes TaN and the second metal region includes Ta, the adjustment in work function of the combined first and second regions by varying the thickness of the first metal region between about 0 and 80 Angstroms is at least about 120 mV, 140 mV, 160 mV, 180 mV or 200 mV when the second metal region is kept constant at 900 Angstroms and the second metal region is formed on the second metal region without exposing the first metal region to air. In comparison, when the same TaN/Ta gate stack structure is formed after the first metal region has been exposed to air, the work function adjustment provided by varying the first metal region thickness between 0 and 80 Angstroms is at most about 100 mV.

Another aspect of the invention relates to a method of manufacturing an integrated circuit comprising forming at least a first field effect transistor of a first conductivity type having a first dopant profile and a gate stack comprising a dielectric layer, a first metal region made from TaN over the dielectric layer and a second metal region made from Ta over the first metal region; and forming at least a second field effect transistor of a second conductivity type having second dopant profile and a gate stack comprising a dielectric layer, a first metal region over the dielectric layer and a second metal region over the first metal region, wherein when the first dopant profile and second dopant profile are substantially the same. In one or more embodiments, the methods are effective to change the work function of the combined first and second regions by varying the thickness of the first metal region by a first amount between about 0 and 80 Angstroms by at least about 20%, 40%, 60%, and 80% greater than the change in effective work function of the combined first and second regions when the thickness of the first region is varied by the same first amount but exposed to air prior to formation of the second region.

In other embodiments, integrated circuits including at least two field effect transistors are provided. According to one embodiment, the integrated circuit includes a first conductivity type having a first dopant profile and a gate stack comprising a dielectric layer, a first metal region over the dielectric layer and a second metal region over the first metal region and at least a second field effect transistor of a first conductivity type having second dopant profile and a gate stack comprising a dielectric layer, a first metal region over the dielectric layer and a second metal region over the first metal region, wherein when the first dopant profile and second dopant profile are substantially the same, the thickness of the second metal region of the first and second field effect transistors is substantially the same, the thickness of the first metal region of the first and second field effect transistors is between about 0 Angstroms and 20 Angstroms and the thickness of the first metal region of the first field effect transistor is different than the thickness of the first metal region of the second field effect transistor and the work function of gate stack of the first field effect transistor differs from the work function of the second field effect transistor by at least about 20%. In other embodiments, the difference in work function between the gate stacks of the field effect transistors differs by at least about 40%, 60% and 80%.

For example, when the first metal region of the gate stacks is made from TaN and the second metal region is made from Ta, and the thickness of the first metal region is varied between about 0 Angstroms and 80 Angstroms, the work function of the combined first and second regions in the first gate stack can differ from the work function of the second gate stack by at least about 120 mV. In other embodiments, the work function of the first gate stack and the second gate stack can differ by at least about 160 mV, 180 mV and 200 mV, which is effected by the change in thickness of the first region.

Advantages of the various aspects and embodiments of the invention will be apparent from the following detailed description. It is to be understood that both the foregoing general description and the following detailed description are exemplary and are intended to provide further explanation of the invention as claimed.

BRIEF DESCRIPTION OF THE DRAWING

A more complete appreciation of the subject matter of the present invention can be realized by reference to the following detailed description in which reference is made to the accompanying drawings in which.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

One aspect of the present invention relates to articles of manufacture including, but not limited to gate electrodes and devices that include gate electrodes. Another aspect of the invention relates to methods for manufacturing gate electrodes and devices including gate electrodes.

Figure 1:
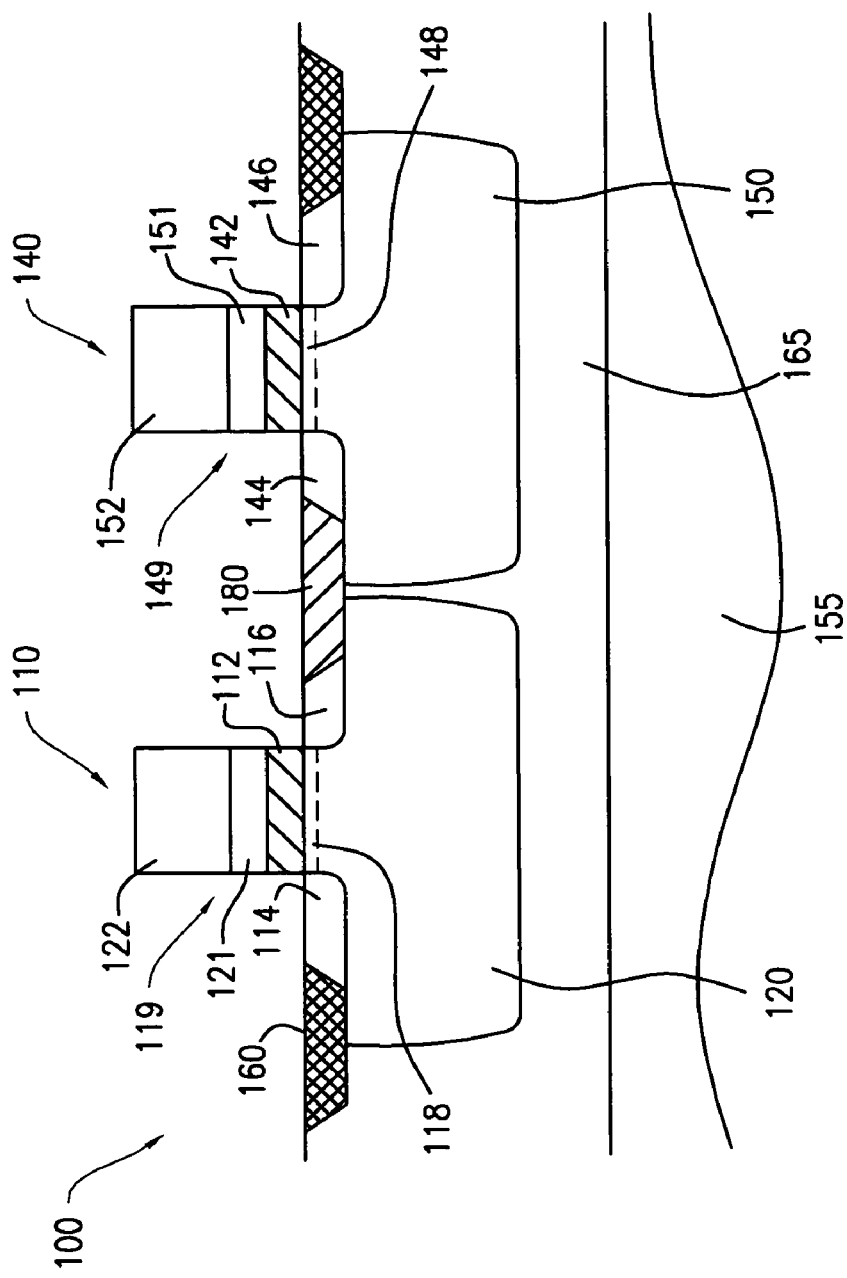
FIG. 1 is a cross-sectional view of a field effect transistor pair.

One or more embodiments of the present invention provides methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon wafer 155 doped with a p-type material, a p-type epitaxial silicon layer 165 on wafer 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a first metal region 121 and a second metal region 122. The source and drain regions are n-type regions on opposite sides of the gate region 119. Channel region 118 is interposed between source region 114 and drain region 116. A gate dielectric layer 112 separates channel region 118 and first metal region 121. Gate dielectric layer 112 electrically insulates first metal region 121 from channel region 118. The gate dielectric layer 112, the first metal region 121 and second metal region 122 together may be referred to herein as a gate stack. The gate dielectric region 112 may be an oxynitride or a high K dielectric such as $HfO_2$. As used herein, high K dielectric refers to a material that has a dielectric constant greater than about 4. The first metal region 121 comprises a conductor material, typically a metal such as tantalum nitride (TaN), which is preferably formed by ALD. The second metal region 122 comprises a metal, for example, tantalum, which may be formed by any suitable process such as PVD. When an appropriate voltage is applied between p-type silicon wafer 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a first metal region 151 and a second metal region 152. The source and drain regions are p-type regions on opposite sides of gate region 149. Channel region 148 is interposed between source region 144 and drain region 146. A gate dielectric 142 separates channel region 148 and first metal region 151.

Dielectric 142 electrically insulates first metal region 151 from channel region 148. The dielectric can be an oxynitride or a high K dielectric such as HfO$_2$. The gate dielectric layer 142, the first metal region 151 and second metal region 152 together may be referred to herein as a gate stack.

In one or more embodiments, the first metal region 151 comprises a metal, typically TaN. The second metal region 152 comprises a metal, for example, tantalum. When an appropriate voltage is applied between p-type silicon wafer 155 and gate region 149, holes from n-well 150 move into region 148 directly below dielectric layer 142 thereby creating a p-type channel 148. A voltage applied between source 144 and drain 146 causes current to flow between source 144 and drain 146.

MOS device design is a complicated process. For example, in the design of MOSFETs, improvements made by maximizing drive current results in increased leakage current. Conversely, an improvement such as decreased leakage current negatively impacts the drive current. Metal gate electrodes may improve drive current by eliminating the depletion effect associated with polysilicon gates, but metal gates may increase leakage current because the metal provides an undesired value of work function, which negatively impacts desired electrical properties of the transistor device.

According to one or more embodiments of the present invention, improved electrical properties of CMOS devices can be realized by changing the electrode work function, which in turn modulates the threshold voltage of the device. This may allow for reduced channel doping, which is expected to improve carrier mobility and drive current, without an increase in the subthreshold leakage current normally associated with channel regions with reduced dopants.

According to one or more embodiments, the work function of the combined first and second regions can be changed by varying the thickness of the first metal region between about 0 and 80 Angstroms. When the thickness of the second metal region is above a certain value such that varying the thickness of the second metal region does not impact the work function of the gate stack, varying the thickness of the first metal region changes the work function of the gate stack. According to one or more embodiments, by forming the first and second metal regions without exposing the first metal region to air prior to formation of the second metal region, significantly greater work function adjustment of the gate stack can be achieved compared to the work function adjustment of a gate stack formed when the first metal region has been exposed to air prior to formation of the second metal region. According to one or more embodiments, the first and second metal region can be formed in a clustered system in which the first region is isolated from air and the second metal region is formed in the clustered system.

As used herein, the term "gate" refers to the insulated gate electrode of a three terminal field effect transistor having a gate, drain and source. Work function is influenced by the electronic and structural properties of the materials used to form the device. Usually, the work function of a gate electrode in a MOS transistor should be close to that of the conduction band edge or close to the valence band edge to provide acceptable electrical performance from the device. There are a limited number of materials that provide acceptable work functions, and some of these materials are difficult to utilize in semiconductor manufacturing processes. Examples of materials that are used in NMOS devices include, but are not limited to, Al and TaSiN. Examples of such materials in PMOS devices include, but are not limited to W, Ru, and Ni.

Exemplary embodiments of the present invention include improved modulation of the work function of field effect transistors and prevention of impurity diffusion into the gate dielectric. According to one or more embodiments, improvements are achieved by the formation of the first metal region 121, 151 by atomic layer deposition (ALD). ALD apparatus are disclosed in U.S. Pat. No. 6,287,965, the contents of which are incorporated herein by reference. Other ALD systems and methods are disclosed in U.S. Pat. No. 6,784,096 and United States Patent Application publication number 2004/019069, the contents of which are incorporated herein by reference. In certain embodiments, further improvements are realized by forming the gate electrodes 119, 149 in a clustered apparatus, wherein the first metal regions 121, 151 and second metal regions 122, 152 are deposited in a load locked system under vacuum, without exposing the first metal region 121, 151 to air after it has been formed. Varying the thickness of the first metal region of a device formed in a load locked system permits a wider range of work function tuning of the gate stack compared to a gate stack formed in which the first metal region is exposed to air prior to formation of the second metal region.

In embodiments in which the dielectric layer 112, 142 is an oxynitride, rapid thermal processing (RTP) can be used for formation of the oxide and decoupled plasma nitridation (DPN) can be used for oxynitride formation. In embodiments in which high K dielectrics are used, atomic layer deposition (ALD) can be used for the manufacture of high K dielectric layers. In preferred embodiments, the dielectric layer is formed by ALD. The metal layers can be formed by physical vapor deposition (PVD). The selection of the particular metal will depend on the specific application. Depending on the substrate and the gate stack architecture (first metal region, second metal region and dielectric layer), work function requirements for sub 60 nm nodes can be divided into two groups: near band edge work function and midgap work function. For bulk CMOS applications, metallic materials with near band edge work functions can be used. For silicon on insulator (SOI) applications, metallic materials with midgap work function can be used.

In certain embodiments, ALD of the first metal regions, and in one particular embodiment, ALD of TaN for the first metal regions, results in one or more advantages of the bilayer gate structure formed thereby. In one or more embodiments, the PVD metal layers subsequently formed on the dielectric layer exhibit enhanced adhesion to the dielectric layer. In certain embodiments, ALD deposited dielectric layers also provide an improved chemical barrier to help prevent the subsequently formed PVD metal from interacting with the dielectric layer either during or after the process. Use of ALD also results in a more stable dielectric layer because the ALD process causes less damage to the dielectric layer than other processes. In one or more embodiments, an ALD deposited dielectric layer provides better work function modulation, which allows for fine tuning of device thresholds through control of the physical thickness of the dielectric layer.

Figure 2:
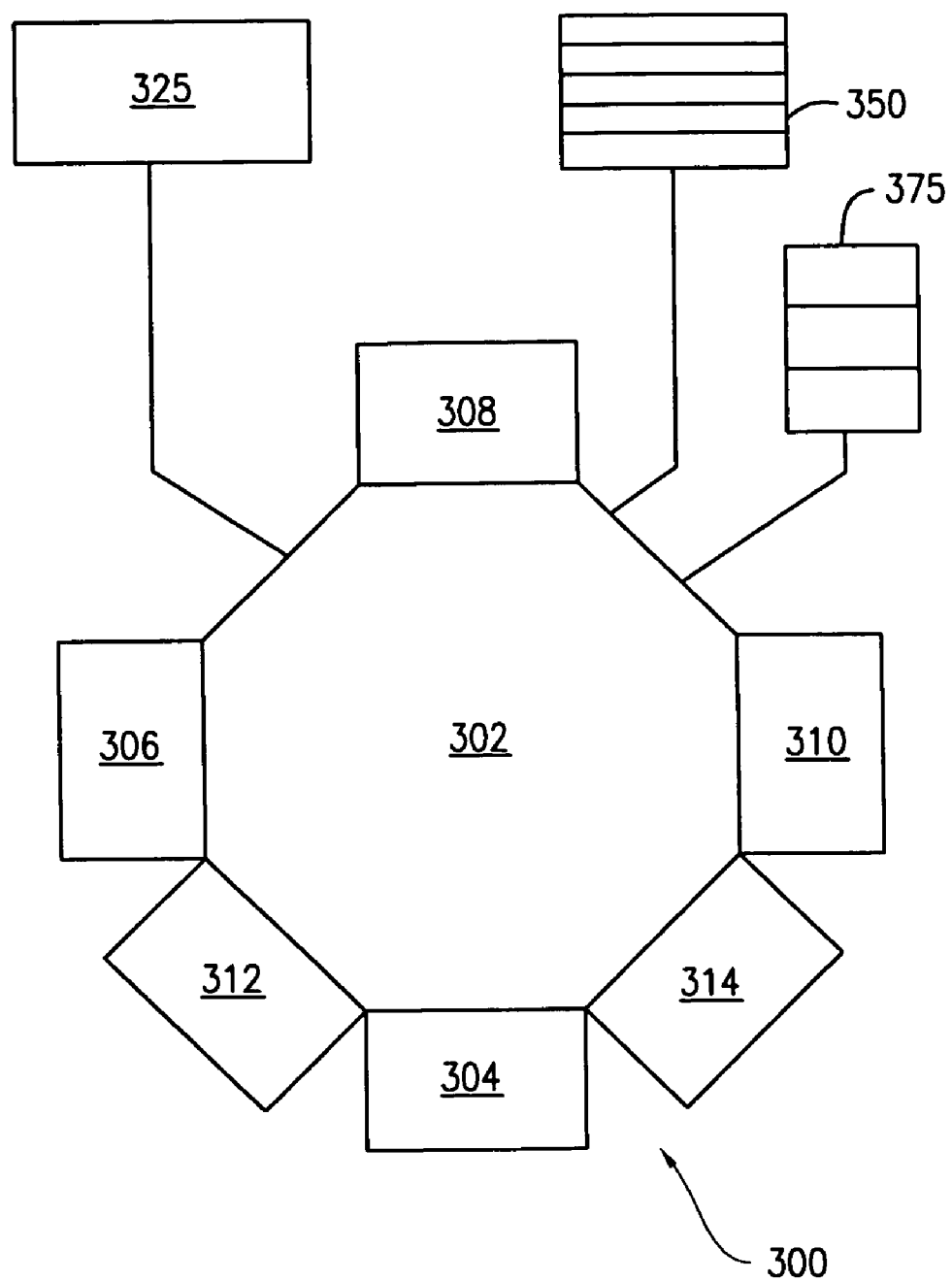
FIG. 2 is a schematic diagram illustrating one embodiment of a substrate processing system.

An exemplary cluster system or tool 300 is shown in FIG. 2. Cluster tools combine several processes within a load locked or vacuum chamber for the purpose of reducing cycle times, reducing wafer handling by operators, reducing particulate contamination, reducing molecular contamination, and initiating difficult processes. Examples of cluster systems include the Centura or Endura systems available from Applied Materials, Santa Clara, Calif. FIG. 2 is a schematic diagram illustrating one embodiment of a substrate cluster processing system 300 having a gas distribution system as described in United States Patent Application Publication Number 20040050325, application Ser. No. 10/243,377, the contents of which are incorporated herein by reference. Processing system 300 may include one or more load-lock chambers 304, one or more process chambers 306, 308, 310, and 312, and a cooldown chamber 314, all of which are attached to a central transfer chamber 302. Processing system 300 may further include a system controller 325 for controlling various operations of processing system 300, power supplies 350 for supplying various forms of energy to processing system 300, and pumps 375 for evacuating various vacuum chambers contained within processing system 300. Each processing chamber can be outfitted to perform a number of substrate processing operations such as cyclical layer deposition, chemical vapor deposition (CVD), physical vapor deposition (PVD), atomic layer deposition (ALD) etch, pre-clean, degas, orientation and other substrate processes. A transfer tool, for example, a robot (not shown), may be used to transfer substrates to and from one or more chambers.

One or more transfer chambers 302 are used to maintain ultrahigh vacuum conditions while allowing substrates to be transferred within the system 300. Any of the substrate processing chambers may be removed from the system 300 if not necessary for a particular process to be performed by the system 300. In one arrangement, processing chambers 306 and 308 may be atomic layer deposition chambers adapted to deposit a high K dielectric layer and a first metal region, and processing chamber 310 may be a cyclical deposition chamber, a chemical vapor deposition chamber, or a physical vapor deposition chamber adapted to form a bulk second metal region. Additional processing chambers such as one or more etch chambers outfitted to etch apertures or openings for interconnect features may also be provided.

The one particular arrangement of the system 300 is provided to illustrate one embodiment of the invention and should not be used to limit the scope of the invention. Other tools/equipment may be used, for example, the INOVA system sold by Novellus systems, USA. Another example of a clustered or multi-chamber processing system is disclosed in U.S. Pat. No. 5,186,718, entitled "Stage Vacuum Wafer Processing System and Method," issued on Feb. 16, 1993, which is incorporated by reference herein.

Experiments were conducted to examine how ALD deposition of a first metal region including TaN and PVD deposition of a second metal region containing Ta over the first metal region in a clustered system influenced work function modulation as a function of changing the thickness of the first metal region. As used herein, clustered deposition, cluster tool and cluster system refers to the sequential formation of regions or layers in a load locked system under vacuum pressure so that the substrate is not exposed to ambient conditions or air between the formation of regions or layers of the device.

The range of threshold voltage adjustment as a function of varying thickness of the first metal region for gate stacks made from TaN/Ta were examined to determine if cluster deposition affected threshold voltage. The interface between the first and second metal regions was also examined to determine if non-clustered deposition introduces extensive oxidation to the interface between the metal regions. The equivalent oxide thickness (EOT) was also examined to determine if oxidation at the metal/metal interface affected this parameter. As used herein, EOT refers to a number used to compare performance of high-k dielectric MOS gates with performance of $SiO_2$ based MOS gates. In other words, EOT indicates the thickness of an $SiO_2$ gate oxide needed to obtain the same gate capacitance as one obtained with a dielectric featuring a higher dielectric constant k. For example, an EOT of 1 nm would result from the use a 10 nm thick dielectric featuring k=39 (k of $SiO_2$ is 3.9).

Two groups of silicon substrates were processed, one group utilizing clustered deposition for formation of first and second metal regions over a silicon oxynitride 50 Angstrom thick gate dielectric layer formed by thermal oxidation, and a second group in which the substrates were exposed to air for four hours after deposition of the first metal region and prior to deposition of the second metal region of the gate stack. In both groups, the first metal region was formed by ALD of TaN at thicknesses of 20, 40, 60, and 80, Angstroms, and the second metal region was formed by PVD of a 900 Angstrom layer of Ta. When the thickness of the second metal region is greater than 200 Angstroms, varying the thickness of the second metal region did not significantly impact the work function of the combined first and second regions. Subsequent processing involved lithography and etching of the substrates, followed by post annealing at about 450° C.

Figure 3:
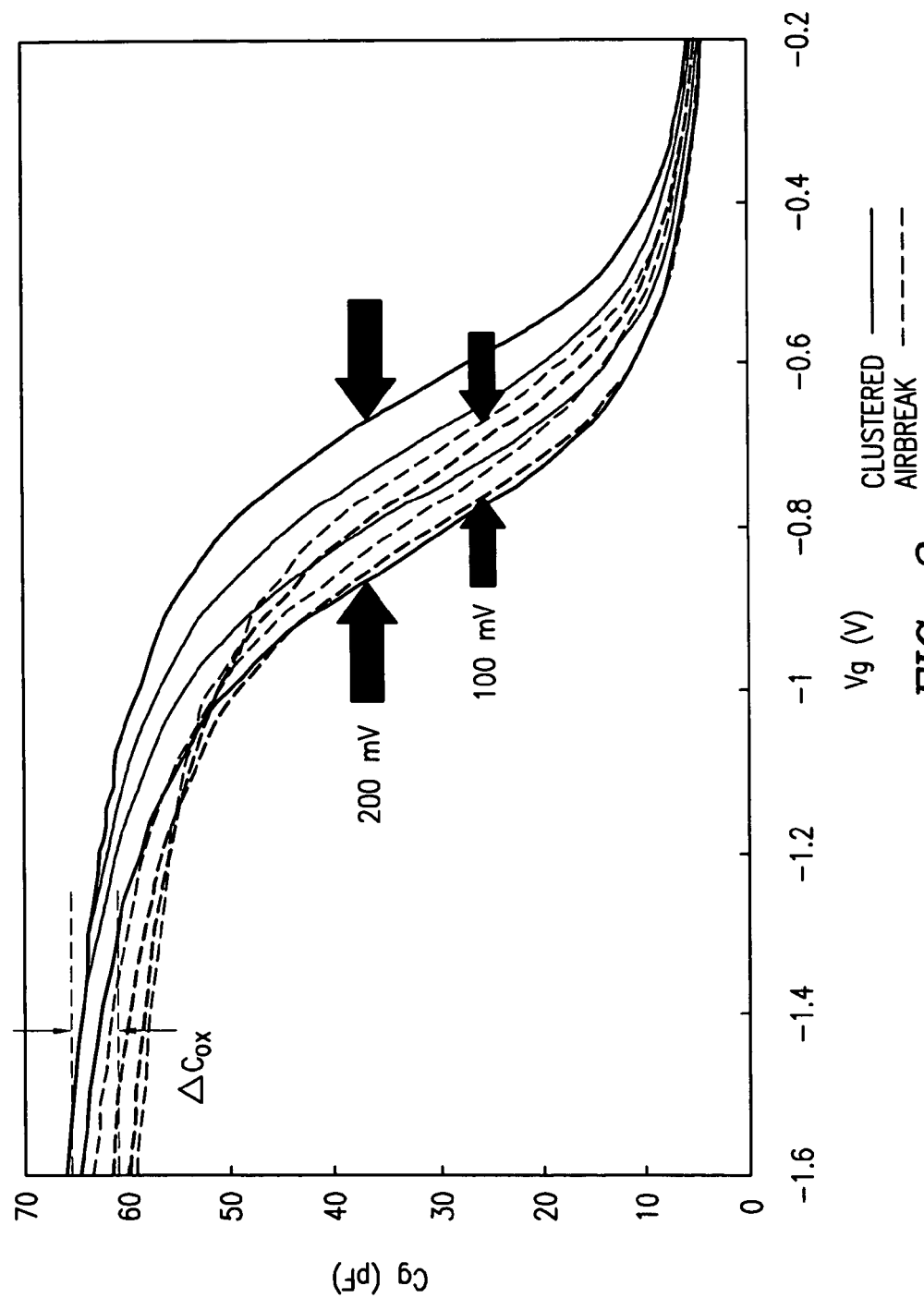
FIG. 3 is a graph showing the capacitance versus voltage of gate stacks made in accordance with embodiments of the present invention.

FIG. 3 shows the capacitance versus voltage of both groups of devices. As shown in FIG. 3, the clustered deposition group represented by the group of solid lines demonstrated a work function adjustment of 200 mV as the thickness of the TaN layer was varied from about 20 to 80 Angstroms. The second group that was processed by exposing the TaN to air for at least four hours (represented by the groups of dashed lines denoted "airbreak" in FIG. 3) exhibited only a 100 mV work function adjustment as the thickness of the TaN layer was varied from 20 to 80 Angstroms. As noted above, in both groups of devices, the second metal region, made from Ta, was kept constant at about 900 Angstroms in thickness.

Thus, preparation of the gate stack using a clustered apparatus or system dramatically improves the modulation of work function, which will ensure proper work function at the gate level and a wider range of work function adjustment for CMOS device manufacture. This example demonstrates that it is possible to change the effective work function of the combined first and second regions by varying the thickness of the first metal region by a first amount between about 0 and 80 Angstroms by at least about 20% greater than the change in effective work function of the combined first and second regions when the thickness of the first region is varied by the same first amount but exposed to air prior to formation of the second region. Still referring to FIG. 3, another benefit of forming the first and second metal regions in a clustered system is a reduced variance of $\Delta C_{OX}$ with thickness at the lower range of the applied voltage.

Figure 4:
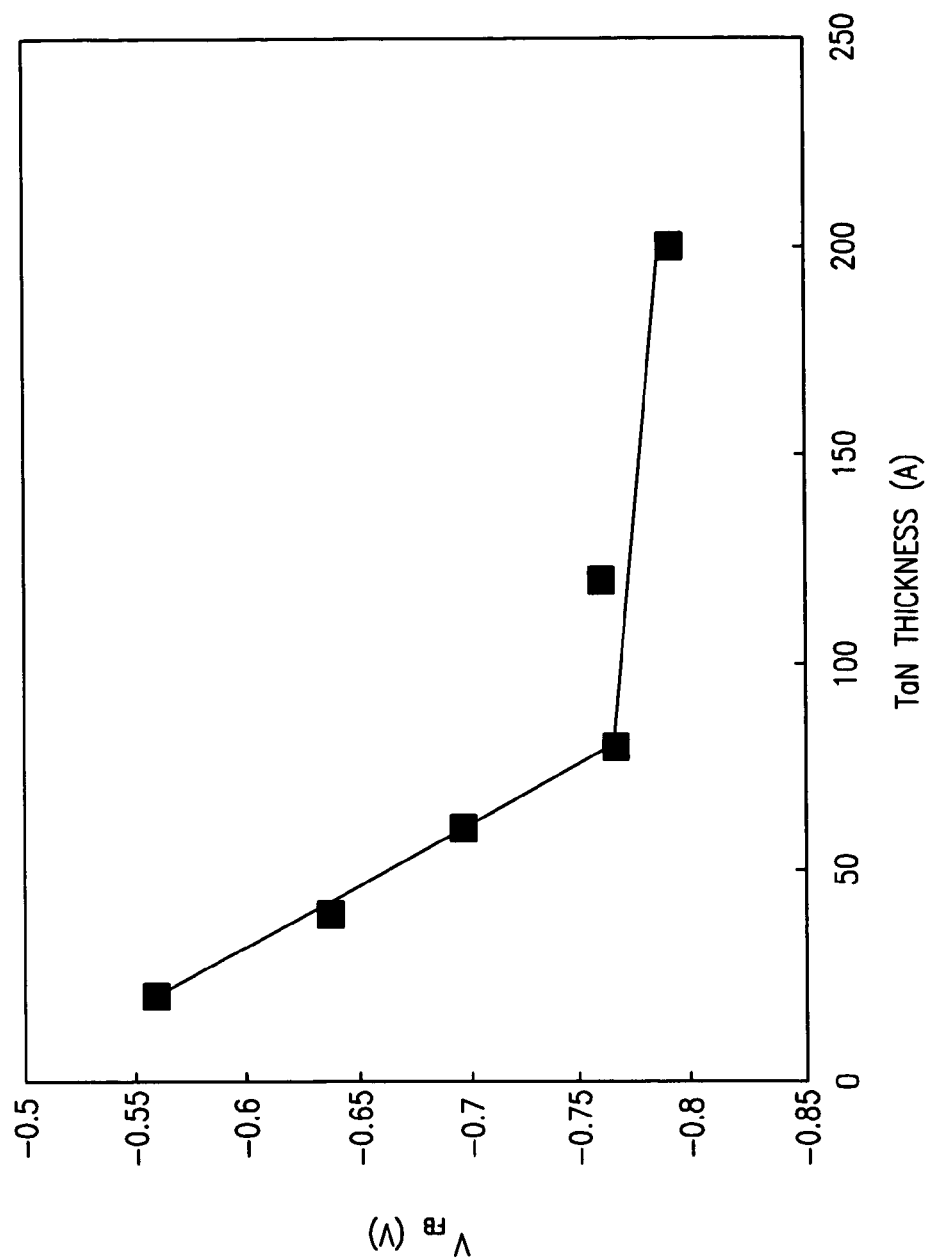
FIG. 4 is a graph showing threshold voltage versus thickness of first metal regions of gate stacks made in accordance with embodiments of the present invention.

Referring now to FIG. 4, the threshold voltage versus TaN thickness is shown for TaN layers deposited by ALD with a Ta top region, formed in a clustered system. The adjustment in the value of threshold voltage is shown to vary between about −0.55 V and −0.75 V. As noted above, as threshold voltage is impacted by work function of the gate stack, the wider range of work function adjustment provided by clustered deposition of the first and second metal regions will enable a greater range of threshold voltage adjustment of the device. Another effect observed in this series of experiments is that the formation of the first and second metal regions in the clustered system reduces the oxidation at the metal interface, retaining the EOT value of the gate stack.

An improvement in the work function adjustment of CMOS gate stacks can thus be realized by formation of the first metal region using ALD. By using ALD, the first metal region can be scaled to much thinner dimensions than can be achieved using other formation processes. ALD formation of the first metal region improves bonding between the first and second metal regions. The ability to better control the interface through the use of ALD is beneficial in NMOS and PMOS devices. Formation of the first metal region using ALD in a clustered system results in even greater control of work function adjustment of the gate stack. Certain embodiments of the present invention enable the production of integrated circuits with various transistors having different threshold voltages, even when the transistors have identical dopant profiles. Thus, in accordance with embodiments of the present invention, integrated circuits may be constructed which have a plurality of FETs, having one or more conductivity types, (for example, PMOS, NMOS, or both), wherein the transistors of one conductivity type may have substantially identical channel doping profiles and second metal gate layer thicknesses but different threshold voltages, which may vary by as much as 20%, 40%, 60% or 80%.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A method of forming a gate electrode comprising:
   forming a dielectric layer on a semiconductor substrate;
   forming a first metal region on the dielectric layer by atomic layer deposition; and
   forming a second metal region on the first metal region, wherein the first metal region and the second metal region are formed in a clustered system and the first metal region is not exposed to air prior to deposition of the second metal region, and varying the thickness of the first metal region by a first amount between about 0 and 80 angstroms changes the effective work function of the combined first and second metal regions by at least 20% greater than the change in effective work function of the combined first and second metal regions compared to when the thickness of the first metal region is varied by the same first amount but exposed to air prior to formation of the second metal region.

2. The method of claim 1, wherein the first metal region includes TaN.

3. The method of claim 2, wherein the second metal region includes Ta.

4. The method of claim 1, wherein varying the thickness of the first metal region by a first amount between about 0 and 80 Angstroms changes the effective work function of the combined first and second metal regions by at least about 40% greater than the change in effective work function of the combined first and second metal regions compared to when the thickness of the first metal region is varied by the same first amount but exposed to air prior to formation of the second metal region.

5. The method of claim 1, wherein varying the thickness of the first metal region by a first amount between about 0 and 80 Angstroms changes the effective work function of the combined first and second metal regions by at least about 60% greater than the change in effective work function of the combined first and second metal regions compared to when the thickness of the first metal region is varied by the same first amount but exposed to air prior to formation of the second metal region.

6. The method of claim 1, wherein varying the thickness of the first metal region by a first amount between about 0 and 80 Angstroms changes the effective work function of the combined first and second metal regions by at least about 80% greater than the change in effective work function of the combined first and second metal regions compared to when the thickness of the first metal region is varied by the same first amount but exposed to air prior to formation of the second metal region.

7. A method of forming a field effect transistor comprising:
   forming a pair of source and drain regions in a semiconductor substrate;
   forming a dielectric layer on the semiconductor substrate;
   depositing a first metal region over the gate dielectric layer using atomic layer deposition, and
   forming a second metal region over the first metal layer
   wherein varying the thickness of the first metal region by a first amount between about 0 and 80 angstroms changes the effective work function of the combined first and second metal regions by at least 20% greater than the change in effective work function of the combined first and second metal regions compared to when the thickness of the first metal region is varied by the same first amount but exposed to air prior to formation of the second metal region.

8. The method of claim 7, wherein the first metal region includes TaN.

9. The method of claim 7, wherein the first metal region and the second metal region are formed in a clustered system and the first metal region is not exposed to air prior to deposition of the second metal region.

10. The method of claim 8, wherein the second metal region includes Ta.

11. The method of claim 7, wherein varying the thickness of the first metal region by a first amount between about 0 and 80 Angstroms changes the effective work function of the combined first and second metal regions by at least about 40% greater than the change in effective work function of the combined first and second metal regions compared to when the thickness of the first metal region is varied by the same first amount but exposed to air prior to formation of the second metal region.

12. The method of claim 7, wherein varying the thickness of the first metal region by a first amount between about 0 and 80 Angstroms changes the effective work function of the combined first and second metal regions by at least about 60% greater than the change in effective work function of the combined first and second metal regions compared to when the thickness of the first metal region is varied by the same first amount but exposed to air prior to formation of the second metal region.

13. The method of claim 7, wherein varying the thickness of the first metal region by a first amount between about 0 and 80 Angstroms changes the effective work function of the combined first and second metal regions by at least about 80% greater than the change in effective work function of the combined first and second metal regions compared to when the thickness of the first metal region is varied by the same first amount but exposed to air prior to formation of the second metal region.

14. A method of forming a gate electrode comprising:
forming a dielectric layer on a semiconductor substrate;
forming a first metal region on the dielectric layer;
prior to exposing the semiconductor substrate with the first metal region thereon to air, forming a second metal region on the first metal region, and varying the thickness of the first metal region by a first amount to change the effective work function of the combined first and second metal regions by at least about 20% greater than the change in effective work function of the combined first and second metal regions compared to when the thickness of the first metal region is varied by the same first amount but exposed to air prior to formation of the second metal region.

15. The method of claim 14 further comprising utilizing a clustered system to form the first metal region and the second metal region; wherein the semiconductor substrate remains disposed within the clustered system during formation of the first metal region until at least completion of formation of the second metal region.

* * * * *